(12) United States Patent
Huo

(10) Patent No.: US 9,117,809 B1
(45) Date of Patent: Aug. 25, 2015

(54) ULTRA-THIN SEMICONDUCTOR DEVICE AND PREPARATION METHOD THEREOF

(71) Applicant: Yan Huo, Shanghai (CN)

(72) Inventor: Yan Huo, Shanghai (CN)

(73) Assignee: Alpha & Omega Semiconductor (Cayman), Ltd., Sunnyvale, CA (US)

( * ) Notice: Subject to any disclaimer, the term of this patent is extended or adjusted under 35 U.S.C. 154(b) by 0 days.

(21) Appl. No.: 14/201,903

(22) Filed: Mar. 9, 2014

(51) Int. Cl.
| | |
|---|---|
| *H01L 21/00* | (2006.01) |
| *H01L 23/495* | (2006.01) |
| *H01L 23/00* | (2006.01) |
| *H01L 21/78* | (2006.01) |
| *H01L 21/56* | (2006.01) |
| *H01L 23/31* | (2006.01) |

(52) U.S. Cl.
CPC .......... *H01L 23/4951* (2013.01); *H01L 21/561* (2013.01); *H01L 21/78* (2013.01); *H01L 23/3107* (2013.01); *H01L 24/97* (2013.01); *H01L 2224/0901* (2013.01)

(58) Field of Classification Search
CPC ..................... H01L 21/561; H01L 2224/0901; H01L 23/3107
USPC .................................................. 438/12, 114
See application file for complete search history.

(56) References Cited

U.S. PATENT DOCUMENTS

| | | | |
|---|---|---|---|
| 2003/0132531 A1* | 7/2003 | Standing et al. ............... | 257/782 |
| 2012/0241922 A1* | 9/2012 | Pagaila ......................... | 257/659 |

* cited by examiner

*Primary Examiner* — Long K Tran
(74) *Attorney, Agent, or Firm* — Chein-Hwa Tsao; Lance A. Li

(57) ABSTRACT

A preparation method of small and ultra-thin power semiconductor device comprising the steps of: providing a chip mounting unit with a plurality of pads with a plate arranged on top surface of each pad; flipping and attaching a semiconductor chip on the chip mounting unit, where the electrodes at the front of the chip are electrically connected to the pads; forming a plastic packaging body covering the chip mounting units and the chip, where the top surface of the plate and the back surface of the chip are exposed out from top surface of the plastic packaging body and the bottom surfaces of the pads are exposed out of the bottom surface of the plastic packaging body; forming a plurality of top metal segments arranged on the top surface of the plastic packaging body and electrically connected to the top surface of each plate and the back surface of the chip.

8 Claims, 8 Drawing Sheets

ULTRA-THIN SEMICONDUCTOR DEVICE AND PREPARATION METHOD THEREOF

FIELD OF PRESENT INVENTION

The present invention generally relates to a semiconductor device and a preparation method thereof, in particular, the present invention relates a small and ultra-thin power semiconductor device and a preparation method thereof.

BACKGROUND OF RELATED ART

In a DC-DC converter, the power consumption of a power device is relatively large. In the improvement of the electric performance and heat dissipation of the power device, metal electrode of the device is exposed from a plastic package material covering a semiconductor chip. For example, US patent publication US2003/0132531A1 shows a semiconductor package 24 including a semiconductor chip with exposed bottom electrode being used for supporting surface mounting technology. As shown in FIG. 1, a power chip MOSFET (Metal-Oxide-Semiconductor Field Effect Transistor) 10 is arranged in an interior space in a metal can 12. A drain electrode at one side of MOSFET 10 is arranged in the interior space and is attached on the bottom of the metal can 12 via conductive silver paste 14 so that the drain electrode is electrically connected to a protruded edge 22 of the metal can 12, while a source electrode and a gate electrode at an opposite side of the MOSFET are coplanar with the upper surface of the protruded edge 22. A low-stress and high-adhesive epoxy 16 is filled in a gap between the MOSFET 10 and the metal can 12. Although the heat dissipation issues have been solved for the package 24, it is expensive to produce such metal can 12. In addition, both the source electrode 18 and the gate electrode are fixed on the semiconductor chip 10, thus it is difficult to adjust the gate electrode to be located at the same line with the protruded edge 22 to match the layout of a bonding pad on a PCB (Printed Circuit Board). Such package is incompatible with the bonding pad of the conventional PCB. Moreover, the on-resistance (RDson) of the power device is relatively large. In the existing wafer-level packaging technology, the semiconductor wafer is thinned to reduce the RDson, but this will result in cracking the wafer.
It is within this context that embodiments of the present invention arise.

BRIEF DESCRIPTIONS OF THE DRAWINGS

The embodiment of the present invention is more sufficiently described hereunder with reference to attached drawings. However, the attached drawings are only used for explaining and illustrating rather than limiting the range of the present invention.

DESCRIPTIONS OF THE SPECIFIC EMBODIMENTS

Figure 2A:
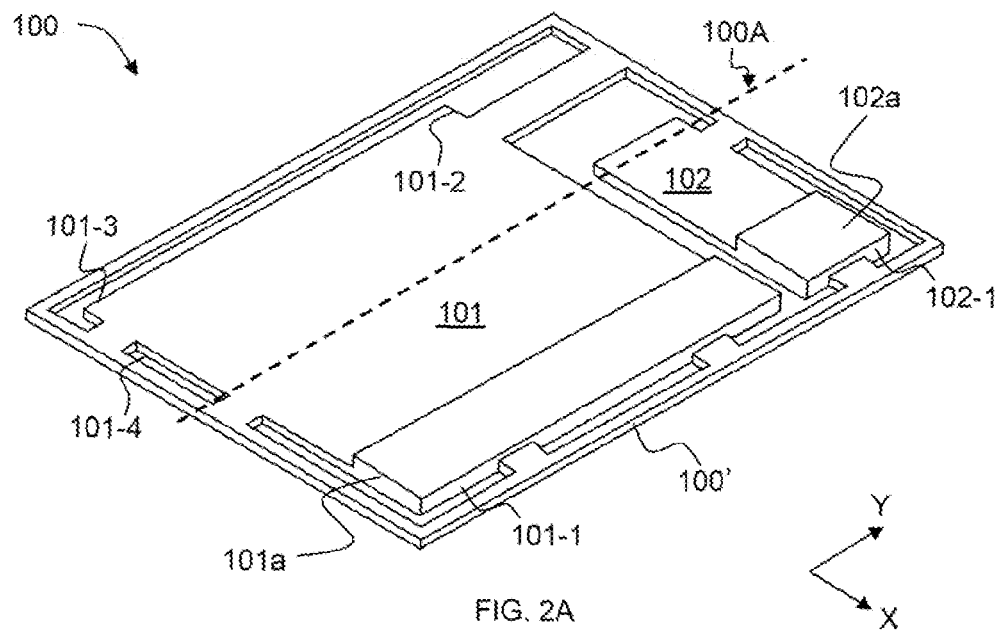
FIGS. 2A-2I are schematic diagrams illustrating a method for preparing a power semiconductor device of the present invention.
Figure 2B:
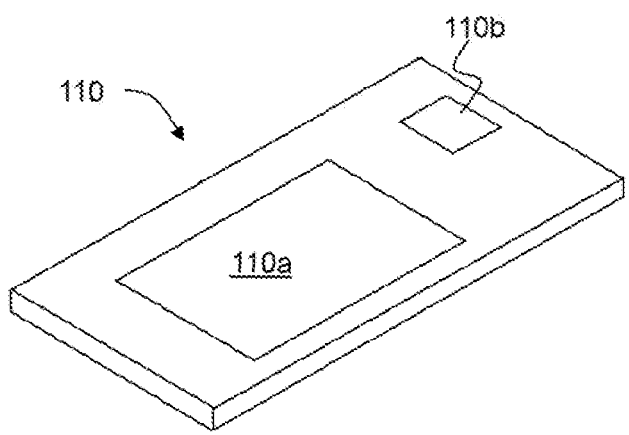

FIG. 2A is a perspective view of a portion of a lead frame 100', which may be referred as an inner lead frame or a first lead frame. The lead frame 100' comprises a plurality of chip mounting unit 100, each of which comprises two inner pads 101 and 102 separated and arranged side by side with the top surfaces of the inner pads 101 and 102 required to be coplanar. Inner pads 101 and 102 are connected to the lead frame 100' via connecting bars (not shown). FIG. 2B shows a semiconductor chip 110, for example a vertical MOSFET, in which the current flows from its front to its back or vice versa. The chip 110 is attached on the chip mounting unit 100 as follows: a source electrode 110a of the MOSFET chip 110 is attached on the bigger pad 101 and the gate electrode 110b of the MOSFET chip 110 is attached on the smaller pad 102.

The structure of the chip mounting unit 100 is optimized to achieve a final compact device. The pad 101 includes two longitudinally opposite edges 101-1 and 101-3 and two transversely opposite edges 101-2 and 101-4. The pad 102 locates close to the edge 101-2 and extends along the length direction of the edge 101-2 from the edge 101-1 to the central line 100A between the edges 101-1 and 101-3. The pad 101 includes a plate 101a arranged at its top surface close to the edge 101-1 and extends along the length direction of the edge 101-1. The pad 102 also includes a plate 102a arranged at its top surface close to and extends along the length direction of the longitudinal edge 102-1 of the pad 102. The edge 102-1 and the edge 101-1 are collinear so that the plates 101a and 102a are also collinear. As such, the chip mounting unit 100 includes a relatively large space on the respective top surfaces of the pads 101 and 102 for attaching the chip 110.

Figure 1:
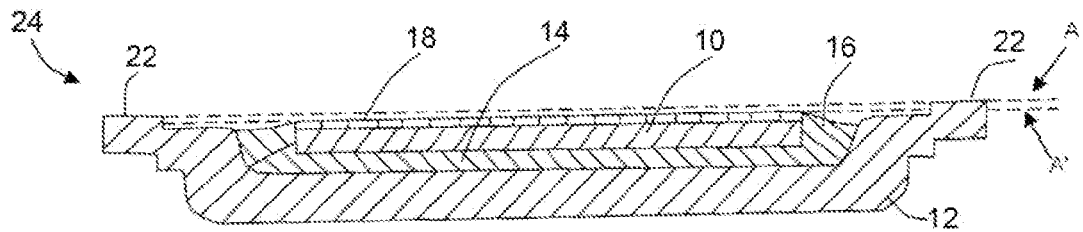
FIG. 1 is a cross-sectional schematic diagram of a semiconductor package in background art.
Figure 2C:
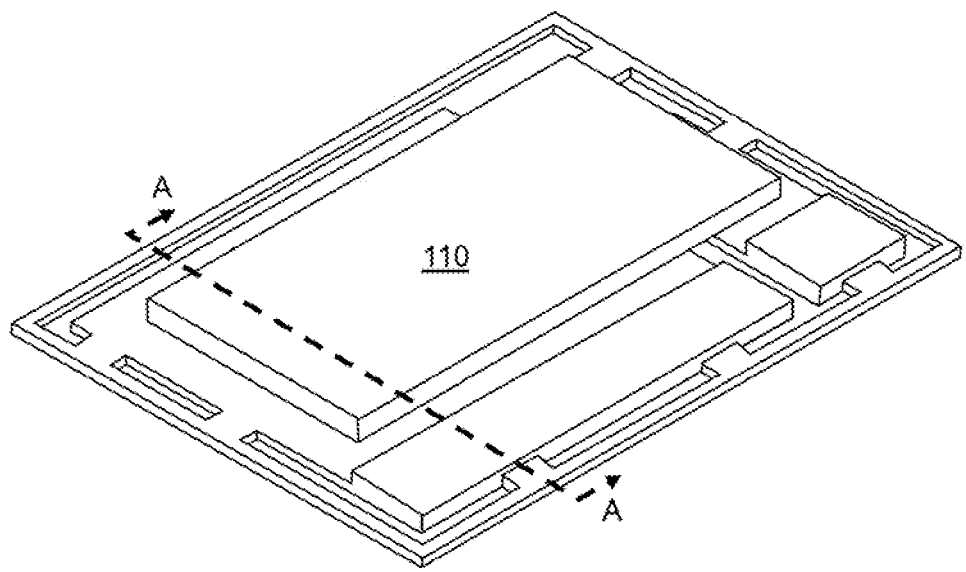
Figures 1, 2D:
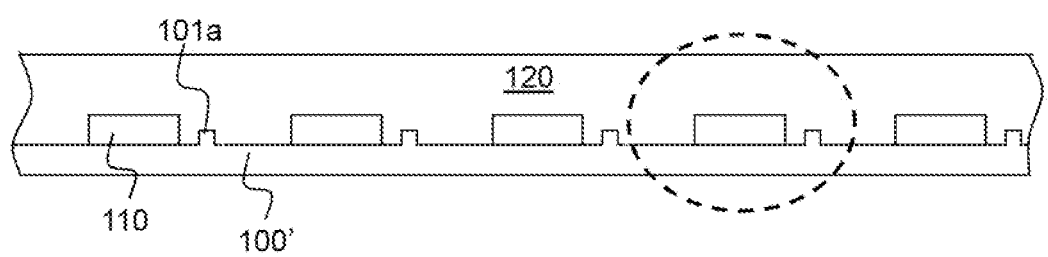
Figures 2, 2D:
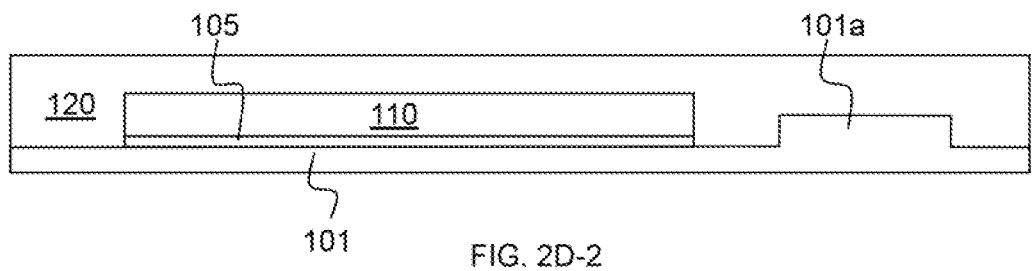

In FIG. 2C, the chip 110 is flipped and attached on the chip mounting unit 100 with the electrodes on its front are accordingly attached to the top surfaces of the inner pads 101 and 102, where the chip 110 is not overlapped on the plates 101a and 102a and is separated with a gap between the chip 110 and the plates 101a and 102a. Then, a first plastic packaging layer 120 made of a plastic packaging material such as epoxy resin is formed covering the front of the lead frame 100' and a plurality of chips 110 attached on the lead frame 100', as shown in FIG. 2D-1. FIG. 2D-2 is a cross-sectional view of an amplified portion framed by a dotted line of FIG. 2D-1. The chip 110 is attached on the chip mounting unit 100 via a bonding material 101, such as solder paste or conductive silver paste. As shown in FIGS. 2D-1 and FIG. 2D-2, the bottom surface of the lead frame 100' or the bottom surfaces of the inner pads 101 and 102 are exposed from the plastic packaging layer 120. Alternatively, the bottom surfaces of the inner pads 101 and 102 are covered by the plastic packaging layer 120 (not shown).

Figures 1, 2E:
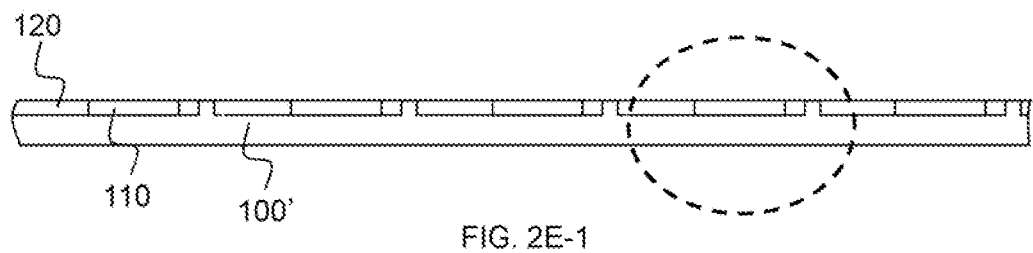
Figures 2, 2E:
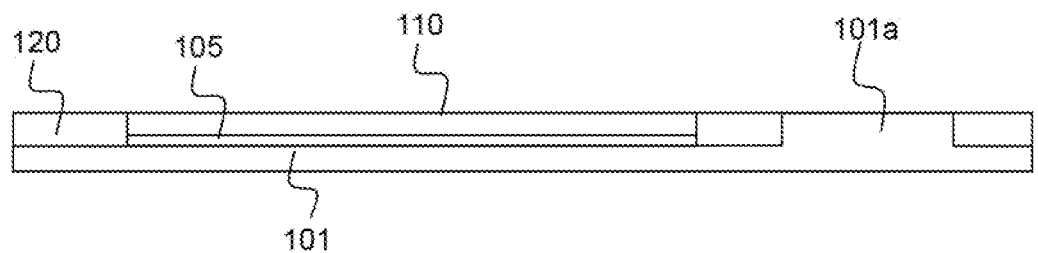
Figures 2, 2E, 3:
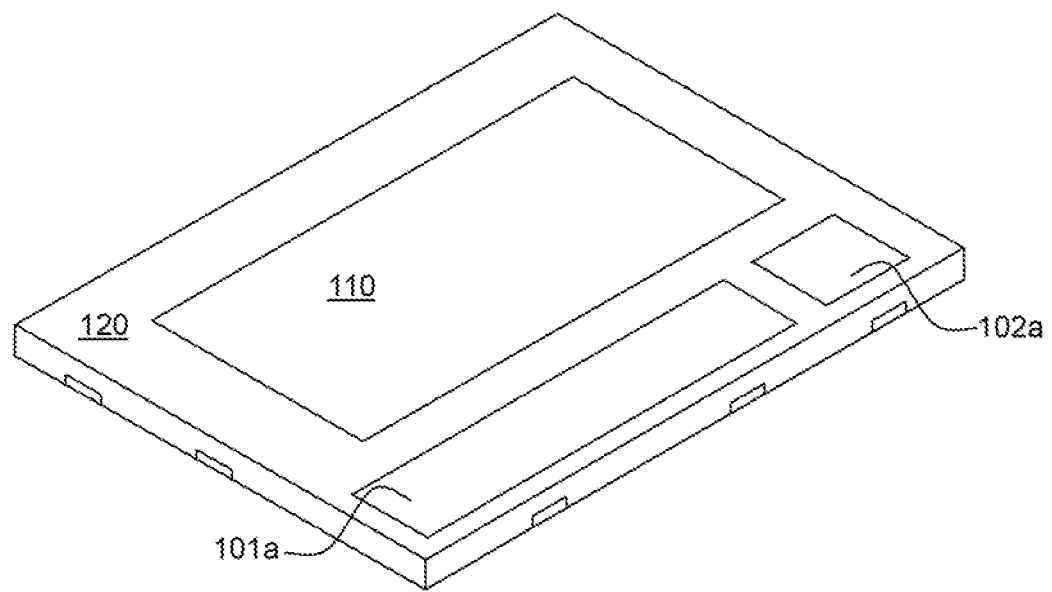

As mentioned above, to achieve a low on-resistance (RDSon) the thickness of the chip 110 must be reduced, for example by grinding, which may have potential risk in cracking the wafer. In the present invention, as shown in FIG. 2E-1, the top surface of the plastic packaging layer 120 is ground to expose the chip 110, and then the back surface of the chip 110 is also ground to reduce the thickness of the plastic packaging layer 120 and the chip 110, thereby achieving a lower RDSon. Due to the physical supporting role of plastic packaging layer 120 and the lead frame 100', the chip 100 is not easy to crack. The plates 101a and 102a are thinner than the chip 110, as such the grinding ends at the top surface of the plates 101a and 102a, so that the final thickness of the chip 110 is generally equal to the height of the plates 101a and 102a. The final thickness of the chip 110 can be adjusted by the height of the plates 101a and 102a. FIG. 2E-2 is amplified cross-sectional schematic diagram of an amplified portion of FIG. 2E-1 framed by the dotted line, and FIG. 2E-3 is perspective view of the structure as shown in FIG. 2E-2. As shown in the figures, the top surfaces of the plates 101a and 102a and the back surface of the thinned chip 110 are coplanar.

Figures 1, 2F:
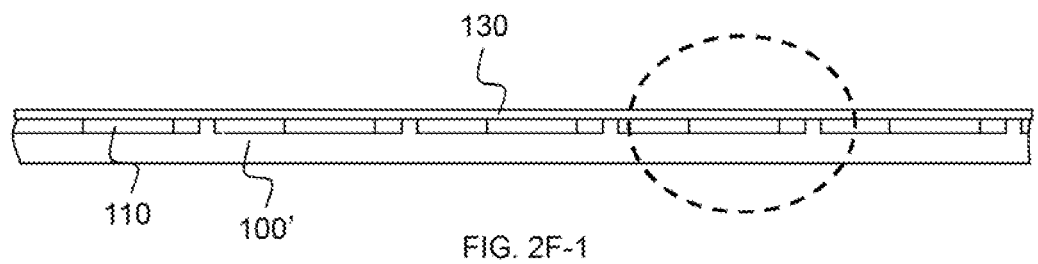
Figures 2, 2F:
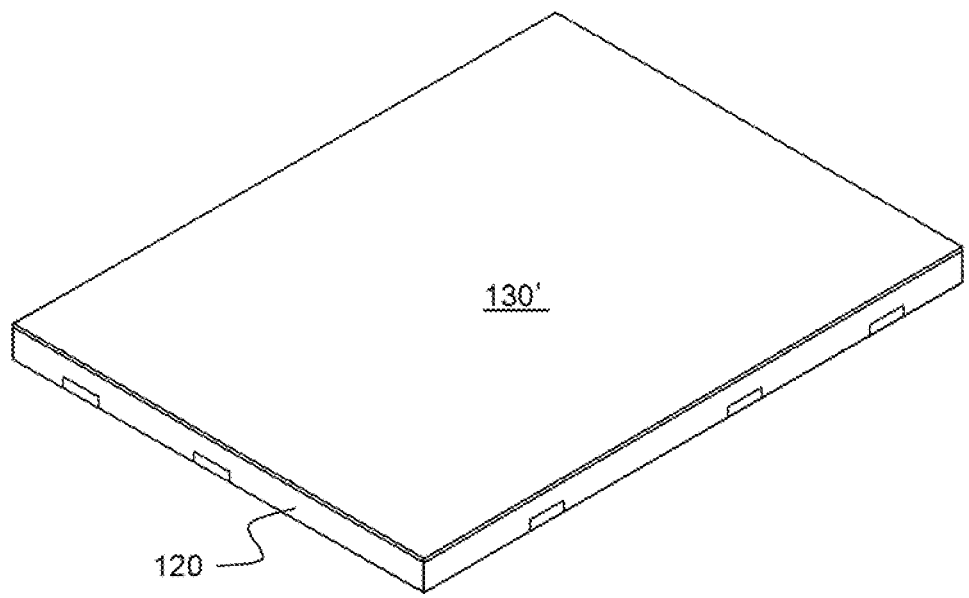
Figures 1, 2G:
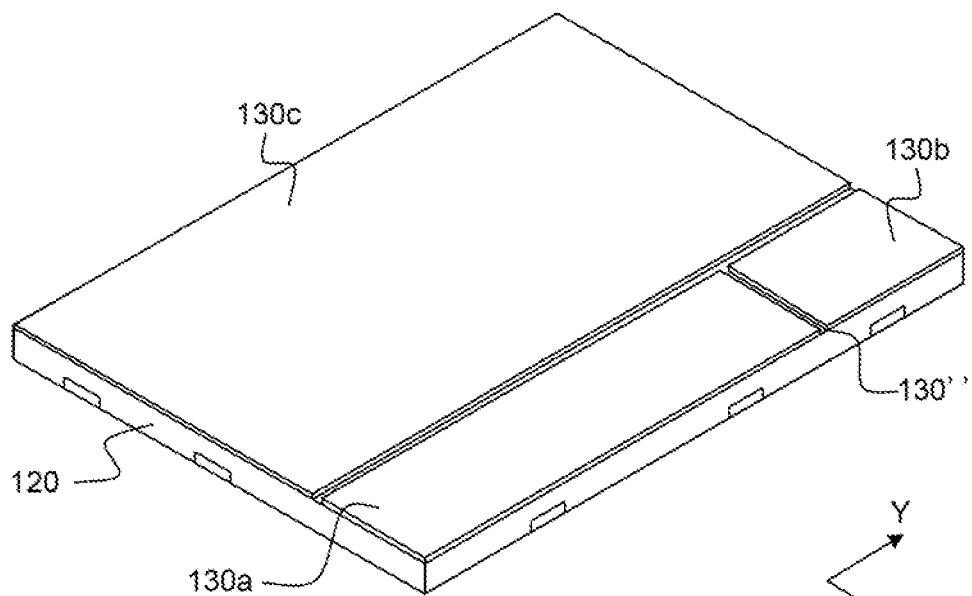
Figures 2, 2G:
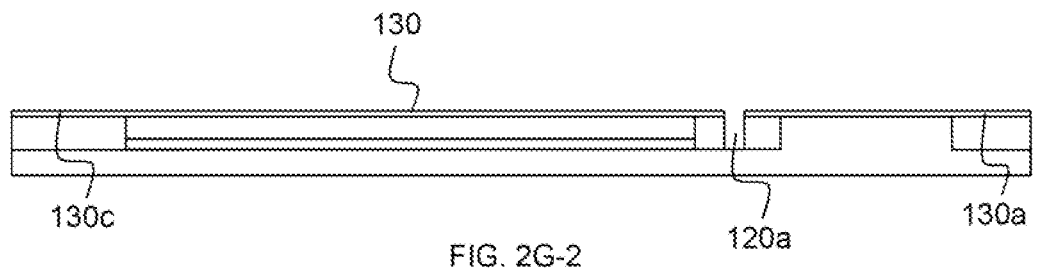
Figure 2H:
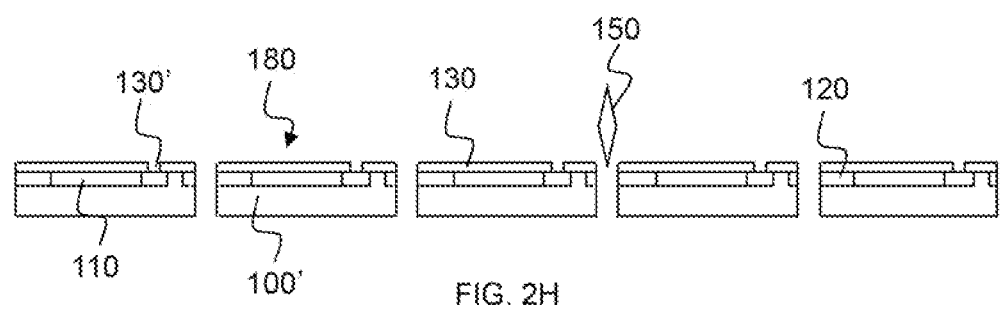

In FIG. 2F-1, a metal layer 130 is formed, by deposition or sputtering, to cover the top surfaces of the thinned plastic packaging layer 120 and the plates 101a and 102a, and the back surface of the thinned chip 110. As such, the metal layer 130 is in electrical contact with the top surfaces of the plates 101a and 102a and the back surfaces of thinned chips 110. FIG. 2F-2 is a perspective view of an amplified portion of the structure framed by the dotted line in FIG. 2F-1. As shown in FIG. 2F-2, a metal layer 130', which is a portion of the metal layer 130, covers each chip mounting unit 100. In an embodiment, heavily doped dopant can be implanted into the back surface of the thinned chip 110 before forming the metal layer 130 to form a better ohmic contact between the metal layer 130 and the drain region at the back of the chip 110 (not shown). As shown in FIG. 2G-1, each metal layer 130' is specifically cut along horizontal and/or vertical cutting lines 130" to divide the metal layer 130' into three top metal segments: the top metal segment 130c is in electrical contact with the back surface of the thinned chip 110, the top metal segment 130a is in electrical contact with the top surface of the plate 101a, and the top metal segment 130b is in electrical contact with the top surface of the plate 102a. The cutting step can be implemented by laser, cutting knives and other tools. Optionally, individual metal layers 130' can be separated from each others in this cutting step. However, the metal layer 130 can be cut to separate individual metal layers 130' in a later cutting step as shown in FIG. 2H. After the metal layer 130' is cut through, the plastic packaging layer 120 is optionally cut along the cutting lines 130" forming a cutting groove 120a in the plastic packaging layer 120 as shown in FIG. 2G-2.

Figure 2I:
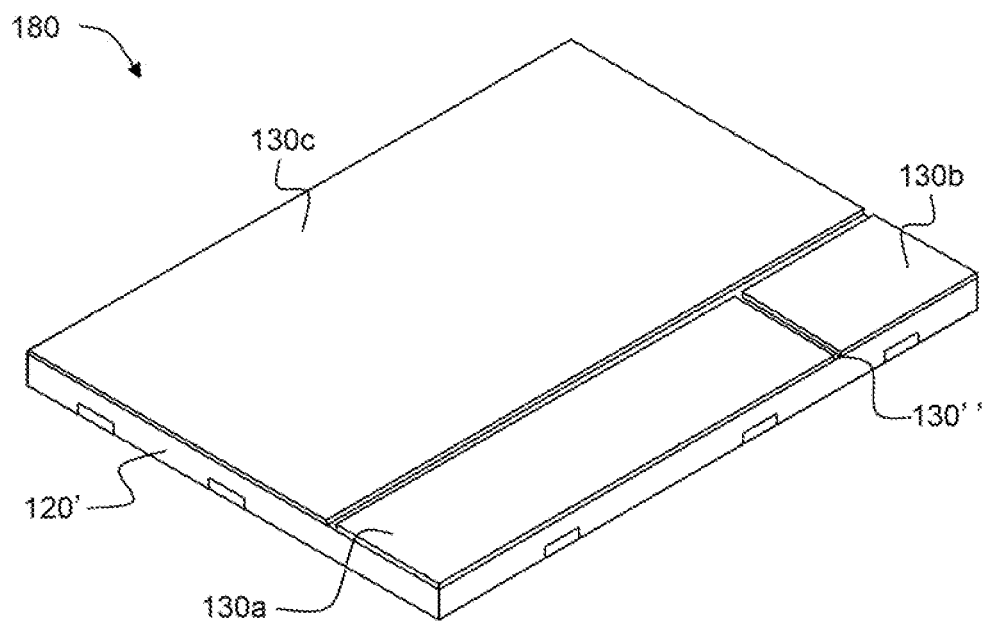

In FIG. 2H, the lead frame 100', the plastic packaging layer 120 and the metal layer 130 between the adjacent chips 110 are cut through with a cutting blade 150, where the connecting bars connecting chip mounting units 100 to the lead frame 100' is also cut off in this step, to separate individual power semiconductor device 180 as shown in FIG. 2I, where the plastic packaging layer 120 is cut into a plurality of plastic packaging bodies 120', each of which cover each chip mounting unit 100. Similarly, the metal layer 130 is cut into a plurality of metal layers 130', each of which covers on each chip mounting unit 100. The plastic packaging body 120' can be referred as the inner plastic packaging body or the first plastic packaging body, which covers the front of chip mounting unit 100 and the side edges of the chip 110, while the top surface of the plates 101a and 102a and the back surface of the thinned chip 110 are exposed out of the top surface of the plastic packaging body 120' (see FIG. 2E-3), then top metal segments 130a-130c are separately arranged on the top surface of the plastic packaging body 120', where the top metal segment 130a is electrically connected to the plate 101a, the top metal segment 130b is electrically connected to the plate 102a, and the top metal segment 130c is electrically connected to the back surface, i.e., the drain electrode, of the chip 110. The formation of the cutting groove 120a in the plastic packaging body 120' is optional. Furthermore, the bottom surfaces of both inner pads 101 and 102 are exposed from the bottom surface of the plastic packaging layer 120'.

Figure 3A:
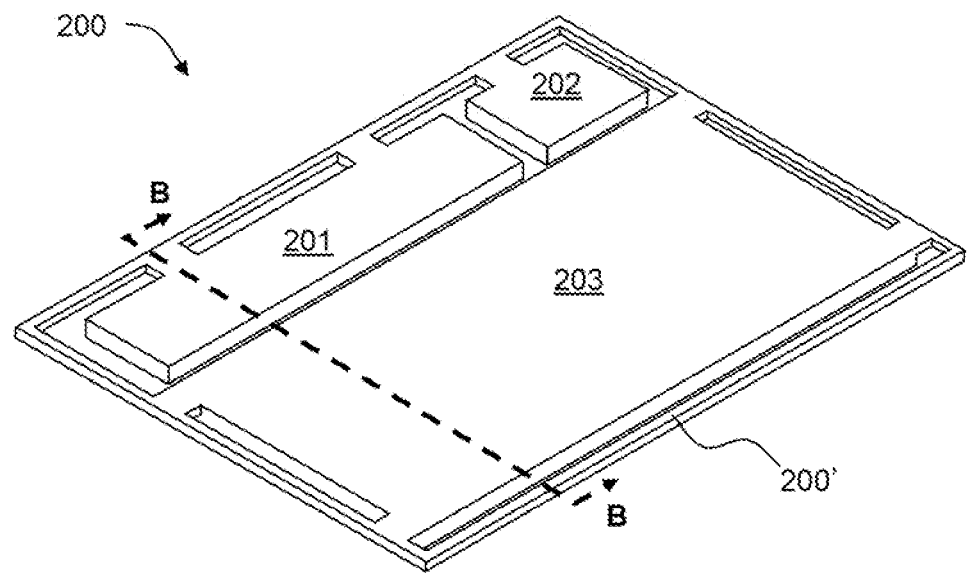
FIGS. 3A-3E are schematic diagrams illustrating a method for preparing a semiconductor package for the semiconductor device obtained using the method of FIGS. 2A-2I.
Figure 3B:
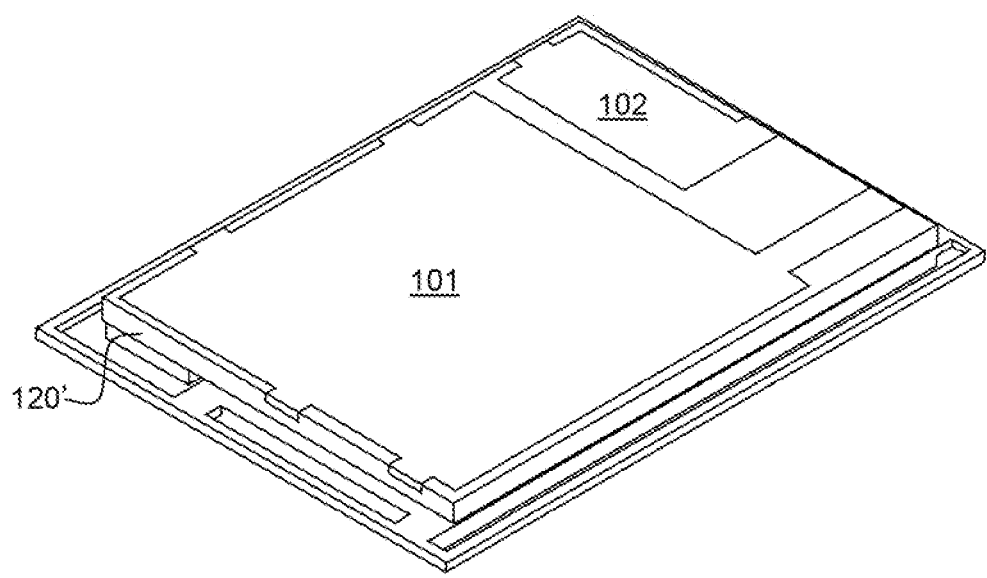

The semiconductor device 180 of FIG. 2I is a final product, in other words, it can be installed directly and separately on a PCB board for use. However, in the embodiments of FIGS. 3A-3D, a series of additional preparation steps are implemented on the semiconductor device 180 of FIG. 2I, thus the semiconductor device 180 may be referred as the primary device, forming the secondary device compatible with different bonding pad layouts on the PCB boards. As shown in FIG. 3A, another lead frame 200' includes a plurality of interconnected units 200. Lead frame 200' can be referred to as an outer lead frame or the second lead frame. Each interconnected unit 200 includes a plurality of outer pads 201, 202 and 203. As shown in FIG. 3B, the semiconductor device 180 of FIG. 2I is flipped and mounted on the interconnected unit 200, where the top metal segments 130a, 130b, and 130c are respectively aligned and attached on the outer pads 201, 202 and 203 one by one respectively through conductive bonding material 115 coated on the top surface of each pad, which is shown in the cross-sectional diagram of FIG. 3C-2. In FIG. 3B, the respective bottom surfaces of the inner pads 101 and 102 are exposed out of the plastic packaging body 120'.

Figures 1, 3C:
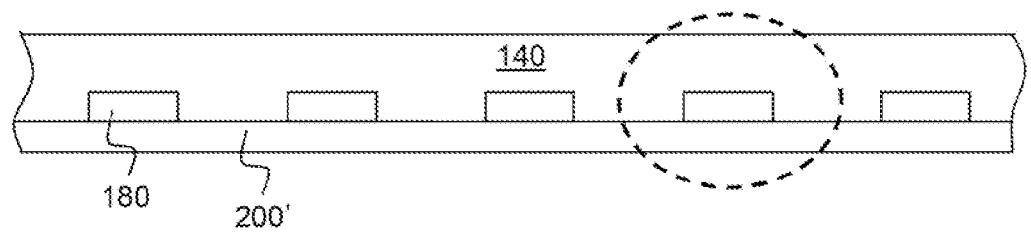
Figures 2, 3C:
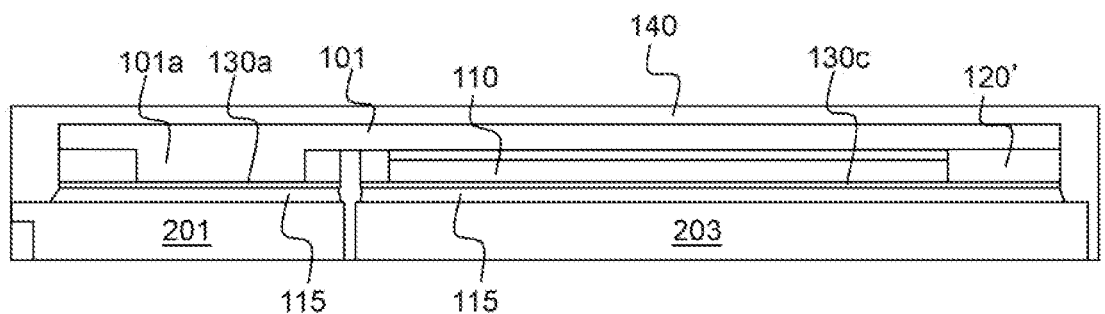
Figure 3D:
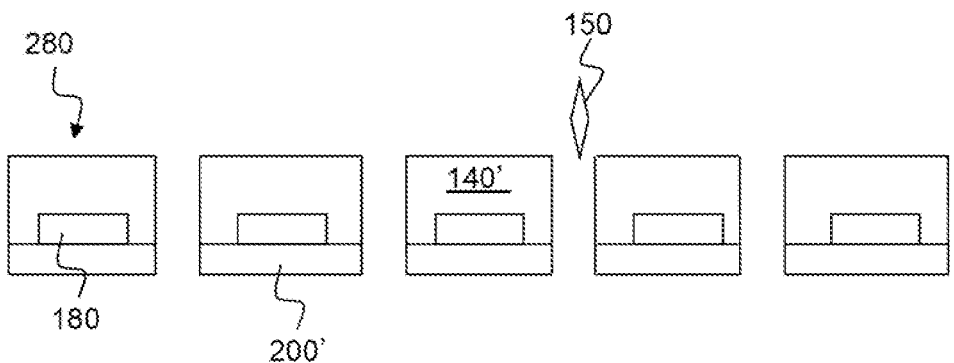
Figure 3E:
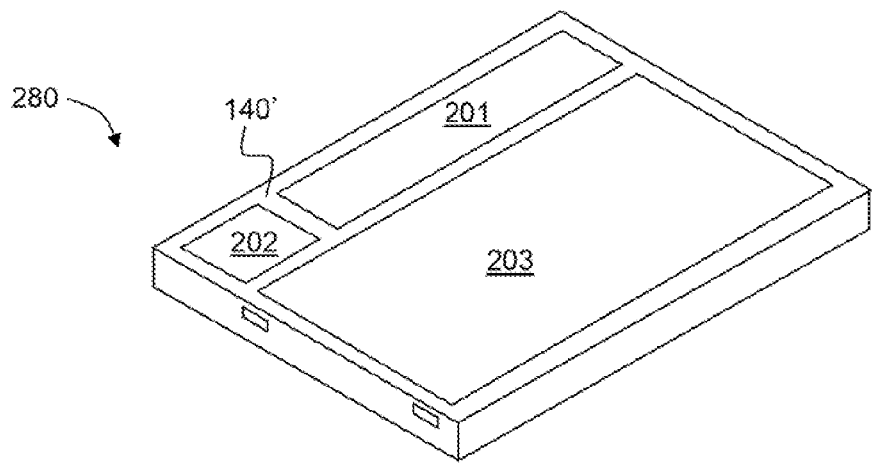

As shown in FIG. 3C-1, a second plastic packaging layer 140 of a plastic packaging material is formed to cover the lead frame 200' and the plurality of semiconductor devices 180 attached on the lead frame 200', while the respective bottom surfaces of the outer pads 201, 202 and 203 are exposed out of the bottom surface of the plastic packaging layer 140. FIG. 3C-2 is a schematic diagram of an amplified portion framed by the dotted line in FIG. 3C-1. If the plastic packaging body 120' includes the cutting groove 120a, the plastic packaging material forming the plastic packaging layer 140, before it is fully solidified, will be filled in the cutting groove 120a. After the plastic packaging material is solidified, the part of the plastic packaging layer 140 located in the cutting groove 120a can be used for clamping. As shown in FIG. 3D, the lead frame 200' and the plastic packaging layer 140 between the adjacent semiconductor devices 180 are cut to form a plurality of semiconductor devices 280, i.e., secondary devices. The plastic packaging layer 140 is cut to form a plurality of plastic packaging bodies 140', which can be referred as the outer plastic packaging body or the second plastic packaging body. In this step, the connecting bars connecting the interconnected units 200 to the lead frame 200' are cut off. The interconnected unit 200 and the semiconductor device 180 are covered by one of the plastic bodies 140' with the respective bottom surfaces of the outer pads 201-203 exposed out of the bottom surface of the plastic packaging body 140', as shown in FIG. 3E, which shows the bottom surface of the plastic packaging body 140' facing upwards. In FIG. 3C-2, although the bottom surfaces of the inner pads 101 and 102 are exposed out of the bottom surface of the plastic packaging body 120', they are covered by the plastic packaging layer 140; therefore, the bottom surface of the pads 101 and 102 are also covered by the plastic packaging body 140'.

Figure 4A:
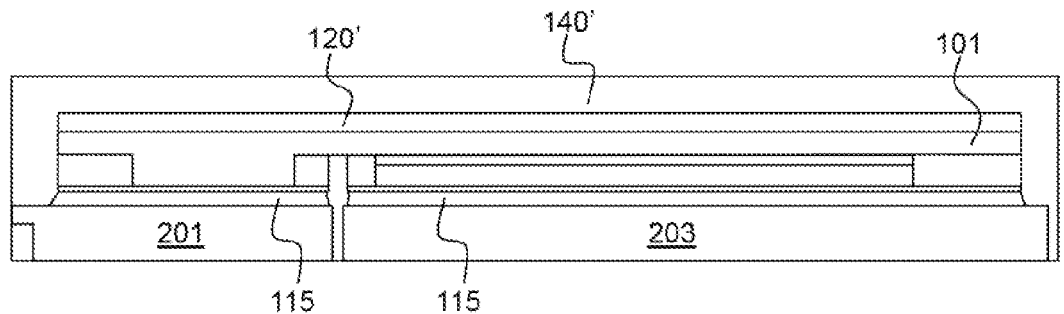
FIGS. 4A-4C are schematic diagrams illustrating different structures of the semiconductor package formed by the method of FIGS. 3A-3E.
Figure 4B:
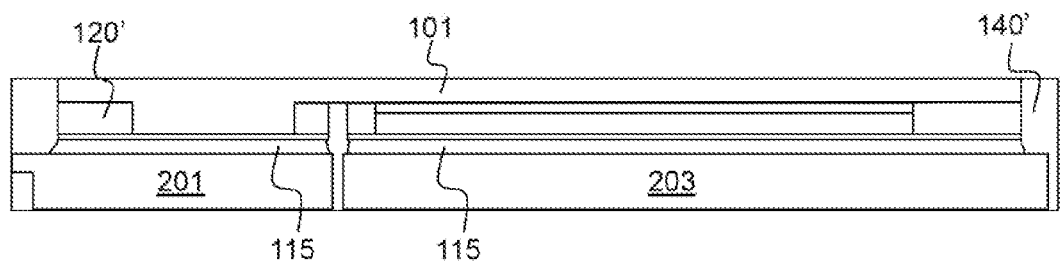
Figure 4C:
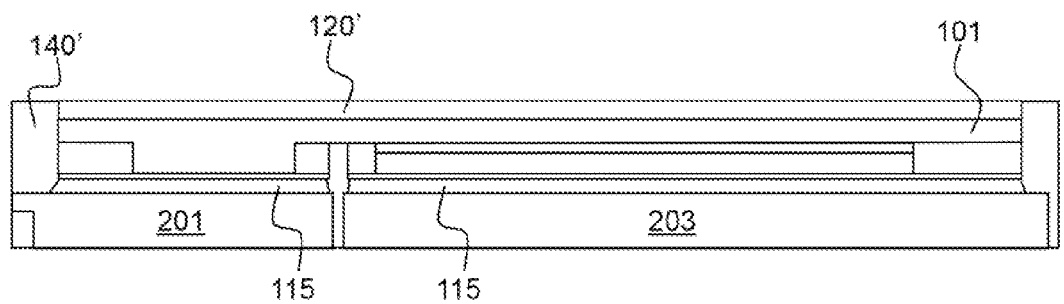

FIGS. 4A-4C are cross-sectional diagrams showing different structures of the power semiconductor devices that can be formed with the processes of FIGS. 3A-3D with some slightly variations. The main difference between the semiconductor device of FIG. 4A and semiconductor device of FIG. 3C-2 is that the bottom surfaces of the inner pads 101 and 102 are completely covered by the plastic packaging body 120' that is covered by the plastic packaging body 140' after the cutting step. The main difference between the semiconductor device of FIG. 4B and the semiconductor of FIG. 3C-2 is that the bottom surfaces of the inner pads 101 and 102 are exposed from the bottom surface of the plastic packaging body 120', and in the step of forming the plastic packaging layer 140, the plastic packaging layer 140 is ground to expose the bottom surfaces of the inner pads 101 and 102, as such the respective bottom surfaces of the inner pads 101 and 102 are exposed from the top surface of the plastic packaging body 140' after the cutting step. In another embodiment shown in FIG. 4C, the bottom surfaces of the inner pads 101 and 102 are covered by the plastic packaging body 120', and in the step of forming the plastic packaging layer 140, the plastic packaging layer 140 is ground to expose the bottom surface of the plastic packaging body 120' from the top surface of the plastic packaging layer 140 or the plastic packaging body 140' after the cutting step.

Above of all, the typical embodiment in a specific structure of the descriptions of the preferred embodiments is given through descriptions and drawings. The above invention proposes the better existing embodiment, but these contents are not used as limit. For those skilled in the art, various modifications and variations are undoubtedly obvious after reading the above-mentioned specification. Consequently, the claims appended hereto should be regarded as all variations and modifications covering the real intention and the scope of the present invention. In the scope of the claims, any and all equivalent scopes and contents should be considered still belonging to the intension and the scope of the present invention.

The invention claimed is:

1. A preparation method of a semiconductor device comprising the steps of:
   providing an inner lead frame with a plurality of chip mounting units, wherein each chip mounting unit comprises a plurality of inner pads with a plate arranged at a top surface of each inner pad close to one side edge;
   flipping and attaching a semiconductor chip on the top surface of each inner pad of the chip mounting unit with a plurality of electrodes on the front of the semiconductor chip electrically connected with the plurality of inner pads one-to-one, wherein the semiconductor chip and the plate are separated from each other;
   forming an inner plastic packaging layer covering the inner lead frame and plurality of semiconductor chips attached on the inner lead frame;
   grinding from the top surface of the inner plastic packaging layer and the back surface of the semiconductor chips until the top surface of the plate and the back surfaces of the thinned semiconductor chips exposing out of the inner plastic packaging layer;
   forming a metal layer to cover the top surface of the inner plastic packaging layer;
   cutting the metal layer into a plurality of top metal segments, each of which is in electrical contact with the top surface of each plate and the back surface of the thinned semiconductor chip respectively;
   cutting through the inner lead frame, the inner plastic packaging layer and the metal layer between the adjacent semiconductor chips to form a plurality of individual semiconductor devices;
   providing an outer lead frame comprising a plurality of interconnected units, wherein each interconnected unit comprises a plurality of outer pads;
   flipping and mounting the semiconductor device on the interconnected unit, wherein the plurality of top metal segments of each semiconductor device are respectively attached on the plurality of outer pads of each interconnected unit one-to-one;
   forming an outer plastic packaging process, covering the outer lead frame and the plurality of semiconductor devices attached on the outer lead frame, wherein the bottom surface of each outer pad is exposed out of the bottom surface of the outer plastic packaging layer; and
   cutting through the outer lead frame and the outer plastic packaging layer between the adjacent semiconductor devices to form a plurality of outer plastic packaging bodies, each of which covers an interconnected unit and a semiconductor device.

2. The method of claim 1, wherein the inner plastic packaging layer covers the bottom surface of each inner pad of each chip mounting unit.

3. The method of claim 1, wherein the bottom surface of each inner pad of each chip mounting unit is exposed out of the bottom surface of the inner plastic packaging layer.

4. The method of claim 1, wherein in the step of cutting the metal layer, the inner plastic packaging layer is cut along a cutting line to form a cutting groove in the inner plastic packaging layer.

5. The method of claim 1, wherein the bottom surface of each inner pad is exposed from the bottom surface of the inner plastic packaging layer; and wherein the respective bottom surfaces of the inner pads are exposed out of the top surface of the outer plastic packaging layer.

6. The method of claim 1, wherein the bottom surface of each inner pad is exposed from the bottom surface of the inner plastic packaging layer; and wherein the outer plastic packaging layer covers the bottom surface of each inner pad and the inner plastic packaging body.

7. The method of claim 1, wherein the inner plastic packaging layer covers the bottom surface of each inner pad; and wherein the outer plastic packaging layer covers the inner plastic packaging layer.

8. The method of claim 1, wherein the inner plastic packaging layer covers the bottom surface of each inner pad; and wherein the bottom surface of the inner plastic packaging layer is exposed from the top surface of the outer plastic packaging layer.

* * * * *